US009653936B2

(12) United States Patent
Saint-Marcoux et al.

(10) Patent No.: US 9,653,936 B2
(45) Date of Patent: May 16, 2017

(54) METHOD FOR MANAGING THE CHARGING OF A RECHARGEABLE BATTERY OF A MOTOR VEHICLE

(75) Inventors: Antoine Saint-Marcoux, Boulogne-billancourt (FR); Yves Le Vourch, Le Chesnay (FR); Maxime Debert, Versailles (FR)

(73) Assignee: Renault s.a.s., Boulogne-Billancourt (FR)

( * ) Notice: Subject to any disclaimer, the term of this patent is extended or adjusted under 35 U.S.C. 154(b) by 206 days.

(21) Appl. No.: 13/981,010

(22) PCT Filed: Jan. 23, 2012

(86) PCT No.: PCT/FR2012/050136
§ 371 (c)(1),
(2), (4) Date: Sep. 24, 2013

(87) PCT Pub. No.: WO2012/101366
PCT Pub. Date: Aug. 2, 2012

(65) Prior Publication Data

US 2014/0009121 A1 Jan. 9, 2014

(30) Foreign Application Priority Data

Jan. 24, 2011 (FR) .................................... 11 50543

(51) Int. Cl.
*H02J 7/00* (2006.01)
*B60L 3/00* (2006.01)
*G01R 31/36* (2006.01)

(52) U.S. Cl.
CPC ............ *H02J 7/007* (2013.01); *B60L 3/0046* (2013.01); *G01R 31/3606* (2013.01); *H02J 7/0091* (2013.01); *B60L 2240/545* (2013.01)

(58) Field of Classification Search
CPC ................................................ G01R 31/3606
USPC ........................................................ 320/150
See application file for complete search history.

(56) References Cited

U.S. PATENT DOCUMENTS 6,285,163 B1 * 9/2001 Watanabe et al. ............ 320/132
6,486,637 B1 * 11/2002 Nakanishi et al. ........... 320/150
7,583,053 B2 * 9/2009 Kamohara .................... 320/106
2006/0066285 A1 * 3/2006 Minamiura ........... H02J 7/0047 320/132

(Continued)

FOREIGN PATENT DOCUMENTS

EP 2 131 440 12/2009
EP 2131440 A1 * 12/2009

OTHER PUBLICATIONS

International Search Report Issued Mar. 5, 2013 in PCT/FR12/050136 Filed Jan. 23, 2012.

(Continued)

*Primary Examiner* — Samuel Berhanu
*Assistant Examiner* — Tessema Kebede
(74) *Attorney, Agent, or Firm* — Oblon, McClelland, Maier & Neustadt, L.L.P.

(57) ABSTRACT

A method for managing charging of a rechargeable battery including at least one module including at least one electrochemical cell, the method including estimating a heat flow produced in the at least one module using an observer estimating overall internal resistance of the electrochemical cells of the module.

13 Claims, 3 Drawing Sheets

(56) References Cited

U.S. PATENT DOCUMENTS

| | | | | |
|---|---|---|---|---|
| 2007/0120537 | A1* | 5/2007 | Yamamoto | G01R 31/3679 320/150 |
| 2009/0058366 | A1* | 3/2009 | Masuda | 320/135 |
| 2010/0156356 | A1* | 6/2010 | Asakura et al. | 320/148 |

OTHER PUBLICATIONS

French Search Report issued Nov. 11, 2011 in FR 1150543 filed Jan. 24, 2011.

* cited by examiner

METHOD FOR MANAGING THE CHARGING OF A RECHARGEABLE BATTERY OF A MOTOR VEHICLE

BACKGROUND

The present invention relates to a method for managing the charging of a rechargeable battery comprising at least one module which includes a pair of electrochemical cells, or to a method for operating a device for managing the charging of a rechargeable battery comprising at least one module which includes a pair of electrochemical cells. The invention also relates to a device for carrying out such a method and to a motor vehicle comprising such a device. The invention further relates to a data medium for carrying out such a method.

It is known to stop the charging of a battery for an electric vehicle when the voltage measured at the terminals of a pair of cells in parallel exceeds a threshold. In view of the risk of overcharging, it is necessary for the charging process to be stopped in this way as reliably as possible. The intrinsic reliability of a voltage sensor used for this measurement, although very good, is not sufficient to guarantee that charging will be stopped in all cases. In some cases, a cell will thus be overcharged. This results in the initiation of parasitic reactions, which may damage the battery and may even destroy the functionality of the battery. What is even more troublesome is that the parasitic reactions may release toxic gases. In addition, if the heat flow produced by the exothermic reactions exceeds the heat flow dissipated by the cells into the surrounding environment, a thermal runaway is thus produced, resulting in the more or less violent destruction of the battery, even if the charging of the battery has been stopped.

As explained before, if charging is stopped by means of a voltage measurement and this measurement is faulty, the charging currents of the battery might not be stopped, or might not be stopped in time. To rule out this possibility, a current solution consists in measuring the voltage by means of two systems that are completely independent and redundant.

In addition, it appears rather worthwhile to define and to use a reliable indicator for detection of the overcharging of cells via the use of a measurement of the temperature of a module so as to stop, in good time, all overcharging current of the battery. This indicator is then used in a logic for detecting overcharge in order to stop the charging process in time. This indicator can be a complement that is independent of a logic for stopping the charging process, said logic being managed by a computer managing the battery.

It has been noted that the direct use of the temperature measurement is not sufficient for the detection of overcharging. Studies have shown that it is not possible to detect, on the basis of a temperature measurement, an overcharging having thermal runaway. In fact, such a strategy would involve the use of low temperature thresholds, which would be contrary to the optimization of the use of the battery and therefore to the availability of the vehicle.

The use of a temperature measurement to stop the charging of a battery is described in the following documents: US200501 37823, JP201 001 6944 and FR29261 65.

BRIEF SUMMARY

The object of the invention is to provide a method for managing charging, said method making it possible to overcome the problems described above and to improve the methods for managing charging known from the prior art. In particular, the invention proposes a method for managing charging, said method enabling reliable and optimal use of the battery.

In accordance with the invention, the method makes it possible to manage the charging of a rechargeable battery comprising at least one module which includes at least one electrochemical cell. The method comprises a phase of estimating a heat flow produced in the at least one module by using an observer estimating the overall internal resistance of the cells of the module.

The estimating phase may comprise a step of defining a thermal model of the at least one module containing the at least one cell and/or a step of measuring a temperature of the at least one module containing the at least one cell.

The estimation of the heat flow produced in the at least one module can be used to determine an order to stop the charging of the at least one module or of the battery.

The charging of the at least one module or of the battery can be stopped when the estimated overall internal resistance exceeds a predetermined threshold or is significantly different compared to estimated internal resistances in other modules.

The invention also relates to a data storage medium readable by a computer on which is stored a computer program comprising computer program code means for carrying out the phases and/or steps of the management method defined above.

In accordance with the invention, a device for managing the charging of a rechargeable battery comprising at least one module which includes at least one electrochemical cell is characterized in that it comprises hardware and/or software means for carrying out the management method defined above.

The hardware and/or software means may comprise a means for estimating the heat flow produced in the at least one module.

The means for estimating the heat flow produced in the at least one module may comprise a means for measuring a temperature of the module comprising said one or more cells and a means for thermal modeling of the at least one cell.

The device may comprise a battery charger and a means for manipulating the battery charger and/or an interrupter controlled so as to connect or disconnect the battery charger to/from the at least one module.

In accordance with the invention, a motor vehicle, in particular an electric or hybrid motor vehicle, comprises a device as defined above.

In accordance with the invention, a computer program comprises a computer program code means designed to implement the phases and/or steps of the method defined above when the program runs on an on-board processor or computer.

BRIEF DESCRIPTION OF THE DRAWINGS

The accompanying drawings show, by way of example, an embodiment of a device for managing charging, said device carrying out an embodiment of the management method according to the invention.

DETAILED DESCRIPTION

Figure 1:
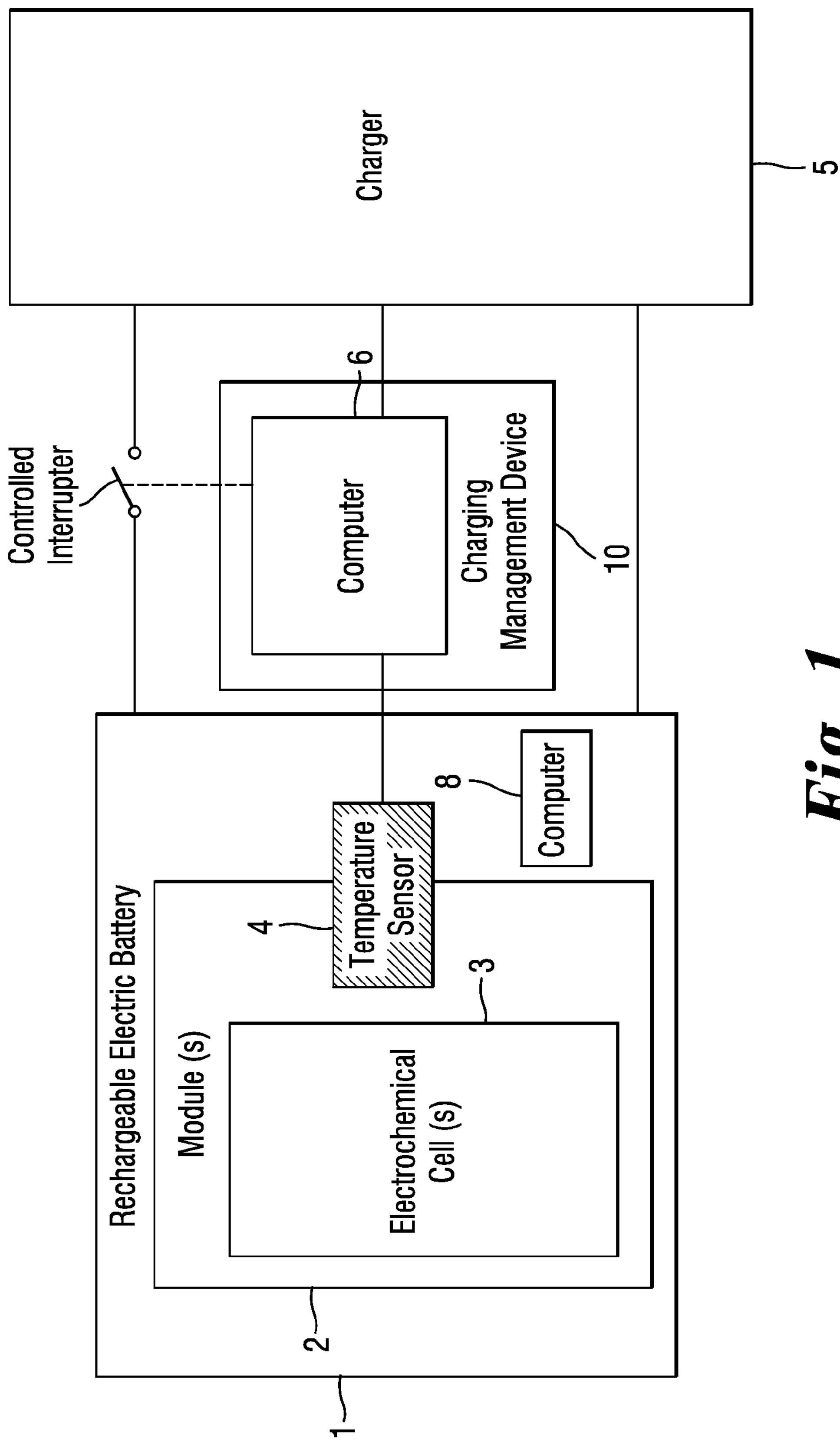
FIG. 1 is a diagram of an electric battery and an embodiment of a device for managing charging according to the invention.

A system, shown in FIG. 1, comprises a rechargeable electric battery 1, a charger 5, and a device 10 for managing the charging of the battery. The battery can thus be charged by the charger under the control of the device for managing charging.

The battery may be of any type. It is preferably a battery of a motor vehicle, in particular a battery for feeding an electric drive motor of an electric vehicle or of a hybrid vehicle.

The battery comprises one or more modules 2 enclosing, in a casing, one or more electrochemical cells 3 or electrochemical accumulators. The different electrochemical cells of the same module are electrically interconnected. Likewise, the different modules of the battery are electrically interconnected. In addition, the battery comprises a computer 8 for managing the battery. The battery, between its two terminals, makes it possible to provide electrical power, and, between its two terminals, is able to receive electrical power when it is charging. The computer 8 comprises a means for managing charging, said means making it possible in particular to detect a normal operating situation in which the charging of the battery must be ended without causing a malfunction. This management means also makes it possible to order such a stop of the charging process.

The charger may be of any type. It is adapted to the features of the battery to be charged thereby. The charger can be connected to the battery or disconnected from the battery by means of a controlled interrupter 7.

The device 10 for managing the charging of the battery makes it possible in particular to detect a situation in which the battery is charged and, where necessary, to order a stop of the charging of the battery by the charger. To do this, the device for managing charging comprises hardware and/or software means for carrying out the method for managing charging according to the invention. In other words, it comprises hardware and/or software means making it possible to govern its operation in accordance with the method of the invention.

Figure 2:
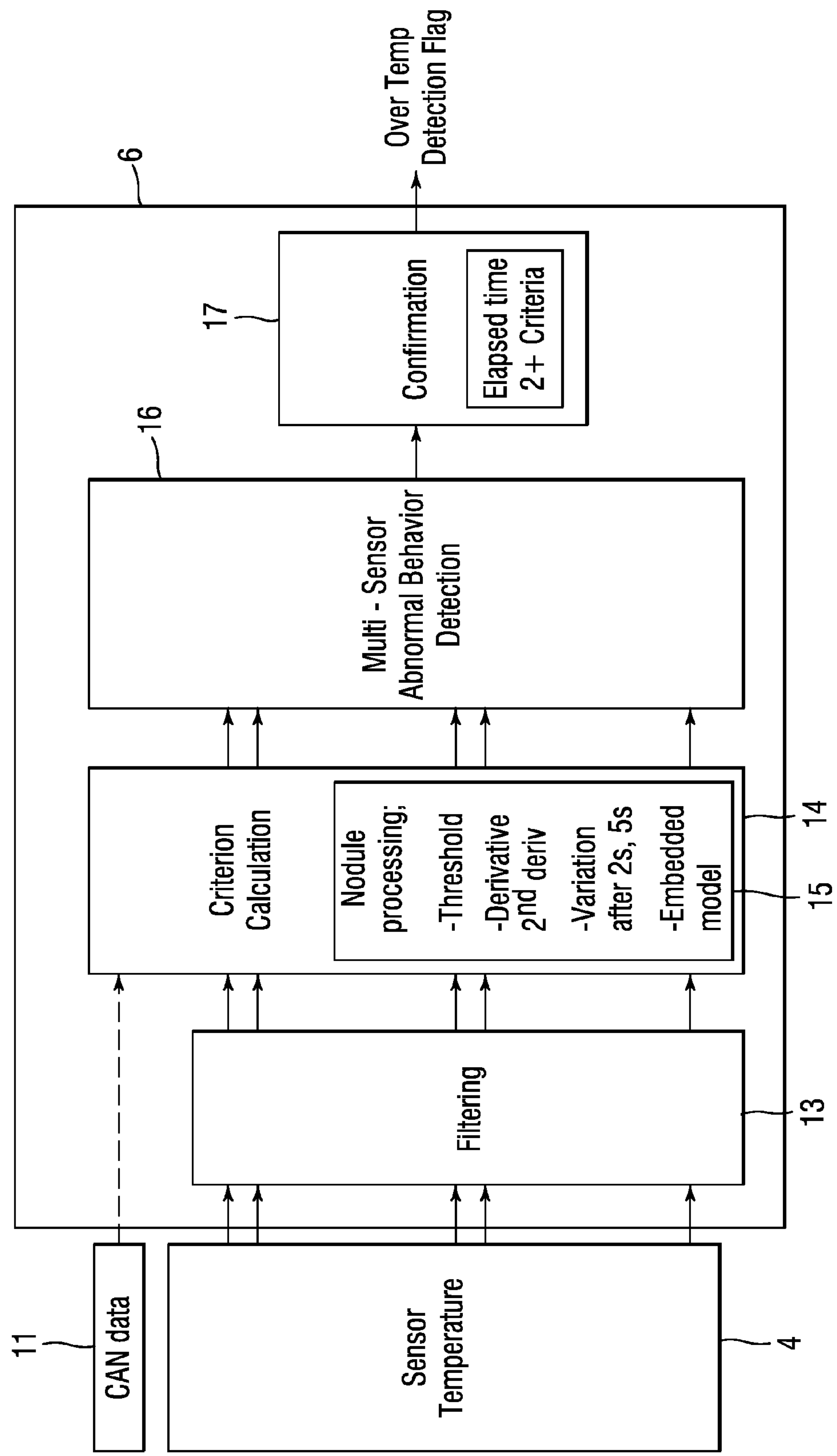
FIG. 2 is a diagram of a logic architecture of an embodiment of a device for managing charging according to the invention.

The management device comprises a computer 6 or a manipulation means described hereinafter with reference to FIG. 2. The computer is attacked, for example, by a signal for measuring the temperature of a module, and, where necessary, by other signals circulating on a data bus 11. The temperature measurement signal is filtered by a filtering means 13. The filtered measurement signal and any other signals circulating on the data bus 11 are then provided to a calculation means 14 comprising in particular a thermal model 15 of the module. This calculation means generates a signal provided to a means 16 for detecting abnormal function of the module. This detection means outputs a logical signal indicating a normal function or abnormal function of the module, in particular a signal indicating whether or not the battery is overcharged. This logical signal is provided to a validation means 17 making it possible to validate the previously mentioned logical signal and outputting a signal indicating whether or not the battery is overcharged. The validation means can, for example, validate the logical signal attacking it if this logical signal is continuously present at the input for a predetermined period of time.

The signal output by the validation means 17 makes it possible to manipulate the charger and/or to manipulate a controlled interrupter 7 making it possible to connect or disconnect the charger 5 to/from the battery 1.

The controlled interrupter preferably forms part of the device for managing charging. Likewise, the means 4 for determining the temperature preferably forms part of the device for managing charging.

An embodiment of the method for managing charging according to the invention is described hereinafter.

As seen before, when a battery cell is overcharged, the excess energy transferred to the cell triggers undesirable parasitic reactions. These parasitic reactions give rise to formations of gas and to abnormal temperature behavior. It is this behavior that is analyzed in the method according to the invention. The method is based on the detection of an abnormal situation with regard to temperature, such that the overcharging can still be stopped in time. Temperature information measured by a single sensor is not sufficient to detect overcharging early enough, that is to say before thermal runaway, in particular in a situation in which the sensor is not always well positioned.

To anticipate this thermal runaway, it is necessary to derive the temperature signal so as to know the temperature gradient. This temperature gradient would be a useful indicator for stopping the charging process. Unfortunately, this derivative only amplifies the measurement noise.

The detection of an abnormal situation is therefore preferably based on a modeling of thermal transfers at a module in order to determine thermal information as precisely as possible (relative to the intrinsic time constants of the studied system).

The principle consists of estimating the internal resistance of a set of cells of a specific module on the basis of various pieces of information:

temperature information, battery current information, and module cooling information.

As will be seen below, this comes down to an estimation of the heat flow produced in the module.

The temperature information is provided, for example, by a temperature sensor (necessary on a module, on a plurality of modules, or on each module).

The battery current information is calculated, for example, as a function of the voltage and power of the charger (available on the data bus). The uncertainty of the information concerning current is taken into account in the proposed solution: an observer is calibrated so as to be robust with respect to this uncertainty.

The cooling conditions are established so as to define the thermal model of the module and are provided online via the available information on the data bus and are delivered by a cooling system. The invention also functions in the case of a vehicle having no cooling system. In this case, the information is established so as to define the model, and the external temperature measurement is sufficient.

With reference to the equations described below, describing the thermal behavior of a module, it is noted that the internal resistance is also involved in the temperature modeling of the cells. The dynamic of the internal resistance cannot be modeled from the data provided, and is therefore assumed to be zero.

$$\dot{T}cell = \frac{R - ibat^2}{k4} - \frac{Tcell - Tcap}{k1}$$

-continued $$\dot{T}cap = \frac{Tcell - Tcap}{k1} - \frac{Tcap - Tpar}{k2}$$

$$\dot{T}par = \frac{Tcap - Tpar}{k2} - \frac{Tpar - Tair}{k3}$$

$$\dot{R} = 0$$

with:

Tcell: the estimation of the temperature of the cells of the module,

Tcap: the estimation of the temperature of the sensor which measures the air captured inside a module, Tpar: the estimation of the temperature of the wall of the module, R: the estimation of the overall internal resistance of the cells of the module, Tair: the temperature of the air (provided by the cooling system), Ibat: the strength of the current charging the battery.

The dots correspond to the derivatives over time of the temperature variables. The variables bearing this dot therefore indicate the dynamic of the system.

The dynamic of the internal resistance is unknown, and the value of the internal resistance is corrected by using the temperature measurement taken by the sensor. Ibat represents the battery current (estimated on the basis of the voltage of the inverter and the power removed from the electric network). The parameters ki represent different mass thermal capacities and different convective exchange coefficients. These coefficients are evaluated by way of experiment. This modeling makes it possible to take into account the positioning of the temperature sensor not placed closest to the cells (constraint linked to the assembly). In state form (x=[TceH Tcap Tpar R]), these equations become:

$$\dot{x} = \begin{bmatrix} -\frac{1}{k1} & \frac{1}{k1} & 0 & \frac{Ibat^2}{k4} \\ \frac{1}{k1} & -\frac{1}{k1} - \frac{1}{k2} & \frac{1}{k2} & 0 \\ 0 & \frac{1}{k2} & -\frac{1}{k2} - \frac{1}{k3} & 0 \\ 0 & 0 & 0 & 0 \end{bmatrix} x + \begin{bmatrix} 0 \\ 0 \\ \frac{1}{k3} \\ 0 \end{bmatrix} u$$

$$y = [0 \quad 1 \quad 0 \quad 0] \cdot x$$

with u=Tair determining the cooling conditions of the modules. The gap between the modeling and reality is then corrected by the temperature measurement:

$$\begin{cases} \dot{\hat{x}} = A\hat{x} + Bu + K(y - \hat{y}) \\ \hat{y} = C\hat{x} \end{cases}$$

The variables with a circumflex accent indicate the estimation in real time of the variables described above, y represents the temperature measurement.

The experimental results show that the estimation of the internal resistance, in the nominal cases (in the absence of overcharging), remains stable beyond its actual value, whereas in the case of overcharging, the estimation of the value of the internal resistance (image of the heat flow produced in the module) rises considerably.

The estimation R of the value of the internal resistance can thus be used as a criterion for detecting overcharging. This criterion, used in a comparison strategy, makes it possible to effectively detect the overcharging of a cell. If one of the criteria is significantly different from the other criteria provided by comparable modules, there is thus certainly a case of overcharging of a cell. The criterion R estimated for a module is thus compared with at least one other criterion estimated for at least one other module.

The proposed criterion R is based on conventional observation techniques (the criterion is formed from a thermal transfer model corrected by the error between the model and the measurement). The conventional observation techniques make it possible to propose a gain K guaranteeing the convergence of the observation. The criterion R is the criterion output by the observer.

In case of overcharging, the exothermic parasitic reactions generate a heat flow not taken into account in the modeling process mentioned further above, which biases the estimation of the value of the internal resistance obtained on the basis of the thermal modeling, the estimation of the value of the thermal resistance obtained on the basis of the thermal model becoming even greater than its actual value. This phenomenon can therefore be used to stop the charging of the battery and to avoid overcharging.

Thanks to the management method according to the invention, a simple thermal transfer model coupled with a temperature measurement thus makes it possible to estimate the heat flow produced in a module (which results in reliable derivation of a temperature measurement signal). This heat quantity (materialized by the variable R) is then used as an indicator in a strategy for detecting overcharging.

Figure 3:
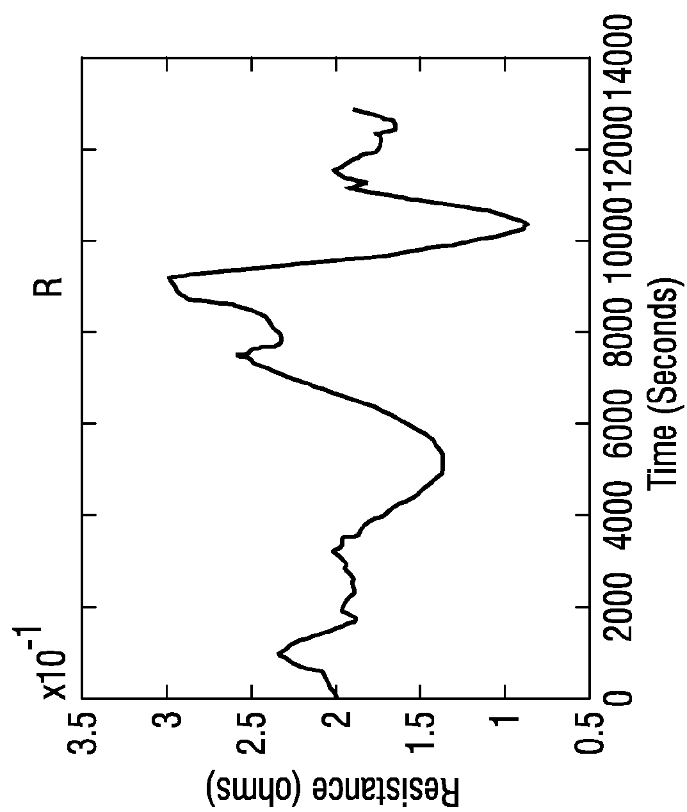
FIG. 3 is a diagram of a first progression over time of an overcharging detection criterion.

In FIG. 3, it is noted that the variable R is substantially constant over time when a module is not overcharged. In this figure, the progressions of the variable R are shown in a graph having an ordinate bearing ohms and an abscissa bearing seconds.

Figure 4:
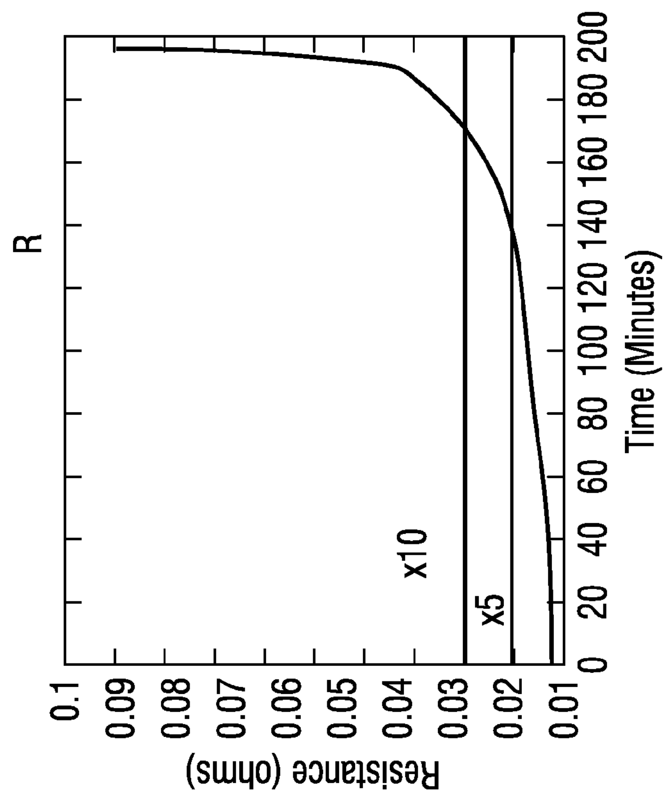
FIG. 4 is a diagram of a second progression over time of the overcharging detection criterion.

In FIG. 4, it is noted that the variable R rises very significantly as soon as the module is overcharged. In this figure, the progressions of the variable are shown in a graph having an ordinate bearing ohms and an abscissa bearing minutes.

The value of the criterion R is provided for example by the calculation means 14.

The invention claimed is:

1. A method for managing charging of a rechargeable battery cooled by a cooling system, including at least one module which includes at least one electrochemical cell, the method comprising:

estimating a heat flow produced in the at least one module by using an observer that depends on a derivative of an estimation of a temperature of cells of the module, a derivative of an estimation of a temperature of a sensor that measures air inside the module, and a derivative of an estimation of a temperature of a wall of the module to define a thermal model of the at least one electrochemical cell of the module, estimating an overall internal resistance of the module from the thermal model, and correcting the overall internal resistance of the module based on a result of the estimating.

2. The method as claimed in claim 1, wherein the estimating the heat flow produced in the at least one module is used to determine an order to stop charging of the at least one module or of the battery.

3. The method as claimed in claim 1, wherein charging of the at least one module or of the battery is stopped when the estimated overall internal resistance exceeds a predetermined threshold or is significantly different compared to estimated internal resistances in other modules.

4. A non-transitory data storage medium readable by a computer on which is stored a computer program that, when executed by the computer, causes the computer to execute:

estimating a heat flow produced in the at least one module by using an observer that depends on a derivative of an estimation of a temperature of cells of the module, a derivative of an estimation of a temperature of a sensor that measures air inside the module, and a derivative of an estimation of a temperature of a wall of the module to define a thermal model of the at least one electrochemical cell of the module, estimating an overall internal resistance of the module from the thermal model, and correcting the overall internal resistance of the module based on a result of the estimating.

5. A device for managing charging of a rechargeable battery comprising:

at least one module which includes at least one electrochemical cell; and hardware and software configured to:

estimate a heat flow produced in the at least one module by using an observer that depends on a derivative of an estimation of a temperature of cells of the module, a derivative of an estimation of a temperature of a sensor that measures air inside the module, and a derivative of an estimation of a temperature of a wall of the module to define a thermal model of the at least one electrochemical cell of the module, estimate an overall internal resistance of the module from the thermal model, and correct the overall internal resistance of the module based on a result of the estimate of the overall internal resistance.

6. The device as claimed in claim 5, wherein the hardware and software comprises a means for estimating heat flow produced in the at least one module.

7. The device as claimed in claim 6, wherein the means for estimating the heat flow produced in the at least one module comprises a means for measuring the temperature of the module comprising the at least one electrochemical cell and a means for thermal modeling of the at least one electrochemical cell.

8. The device as claimed in claim 6, further comprising a battery charger and a means for manipulating the battery charger.

9. A motor vehicle, or an electric or hybrid motor vehicle, comprising a device as claimed in claim 6.

10. The method as claimed in claim 1, wherein the observer defines the thermal model of the at least one electrochemical cell of the module based on temperature information, battery current information, and module cooling information.

11. The method as claimed in claim 1, wherein the estimating the overall internal resistance includes measuring the temperature of cells of the at least one module with the sensor.

12. The device as claimed in claim 6, further comprising a battery charger and an interrupter controlled to connect to or disconnect the battery charger from the at least one module.

13. The method as claimed in claim 10, wherein the module cooling information is delivered by the cooling system.

* * * * *